United States Patent
Becker et al.

(10) Patent No.: US 9,059,423 B2
(45) Date of Patent: Jun. 16, 2015

(54) ELECTRONIC COMPONENT AND ELECTRICAL CONTACT

(75) Inventors: Dirk Becker, Langquaid (DE); Thomas Dobbertin, Regensburg (DE); Thilo Reusch, Regensburg (DE); Erwin Lang, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 158 days.

(21) Appl. No.: 13/387,690

(22) PCT Filed: Jul. 15, 2010

(86) PCT No.: PCT/EP2010/060250
§ 371 (c)(1),
(2), (4) Date: Mar. 29, 2012

(87) PCT Pub. No.: WO2011/012461
PCT Pub. Date: Feb. 3, 2011

(65) Prior Publication Data
US 2012/0175668 A1 Jul. 12, 2012

(30) Foreign Application Priority Data
Jul. 27, 2009 (DE) .................. 10 2009 034 822

(51) Int. Cl.
*H01L 33/00* (2010.01)
*H01L 51/52* (2006.01)

(52) U.S. Cl.
CPC ....... *H01L 51/5203* (2013.01); *H01L 2251/558* (2013.01)

(58) Field of Classification Search
CPC ......... H01L 33/62; H01L 29/41; H01L 33/42; H01L 2924/14; H01L 51/0545
USPC ............... 257/99, E29.112, E33.064, 773, 40
See application file for complete search history.

(56) References Cited

U.S. PATENT DOCUMENTS

| | | | |
|---|---|---|---|
| 6,933,002 B2 * | 8/2005 | Tera et al. ......... | 427/66 |
| 7,242,703 B2 * | 7/2007 | Forrest et al. .......... | 372/39 |
| 7,915,815 B2 | 3/2011 | Birnstock et al. | |
| 2003/0085652 A1 * | 5/2003 | Weaver ......... | 313/506 |
| 2004/0075382 A1 | 4/2004 | Stegamat et al. | |
| 2004/0081855 A1 * | 4/2004 | Kim et al. ......... | 428/690 |
| 2004/0137142 A1 | 7/2004 | Nishikawa | |
| 2007/0114523 A1 | 5/2007 | Oumi et al. | |
| 2007/0120136 A1 | 5/2007 | Noda et al. | |
| 2008/0105299 A1 | 5/2008 | Krasnov | |
| 2008/0136318 A1 | 6/2008 | Kashiwabara | |
| 2009/0009101 A1 | 1/2009 | Kang et al. | |

(Continued)

FOREIGN PATENT DOCUMENTS

| | | |
|---|---|---|
| DE | 103 49 034 | 8/2004 |
| EP | 1 439 588 | 7/2004 |

(Continued)

*Primary Examiner* — Fernando L Toledo
*Assistant Examiner* — Neil Prasad
(74) *Attorney, Agent, or Firm* — Cozen O'Connor (57) ABSTRACT

An electronic component (100), which comprises a substrate (1), at least one first electrode (3) arranged on the substrate (3) and a growth layer (7) on the side of the electrode (3) remote from the substrate (7), wherein the electrode (7) arranged on the growth layer (3) comprises a metal layer (9) with a thickness of less than or equal to 30 nm and the growth layer (7) has a thickness which is less than or equal to 10 nm. An electrical contact is also disclosed.

17 Claims, 5 Drawing Sheets

(56) References Cited

U.S. PATENT DOCUMENTS

| | | |
|---|---|---|
| 2009/0051279 A1 | 2/2009 | Mori et al. |
| 2011/0037379 A1 | 2/2011 | Lecamp et al. |
| 2014/0141549 A1* | 5/2014 | Schmid et al. .................. 438/26 |

FOREIGN PATENT DOCUMENTS

| | | |
|---|---|---|
| EP | 1 701 395 | 9/2006 |
| EP | 1 119 057 | 1/2011 |
| FR | 2 925 981 | 12/2007 |
| JP | 2003-288993 | 10/2003 |
| JP | 2003-303685 | 10/2003 |
| JP | 2004-079422 | 3/2004 |
| JP | 2004-165068 | 6/2004 |
| JP | 2004-311419 | 11/2004 |
| JP | 2006-193363 | 7/2006 |
| JP | 2006 337447 | 12/2006 |
| JP | 2007-013049 | 1/2007 |
| JP | 2007-165284 | 6/2007 |
| JP | 2008-034288 | 2/2008 |
| JP | 2008-166283 | 7/2008 |
| JP | 2008-533655 | 8/2008 |
| JP | 2009-524189 | 6/2009 |
| WO | WO 2008/001241 | 1/2008 |

* cited by examiner

ELECTRONIC COMPONENT AND ELECTRICAL CONTACT

RELATED APPLICATIONS

This is a U.S. national stage of application No. PCT/EP2010/060250, filed on Jul. 15, 2010.

This application claims the priority of German application no. 10 2009 034 822.0 filed Jul. 27, 2009, the entire content of which is hereby incorporated by reference.

FIELD OF THE INVENTION

The present invention relates to an electronic component having an electrode, which is arranged on a growth layer and contains a metal layer, and an electrical contact.

BACKGROUND OF THE INVENTION

In large-area applications thin electrical contacts of electronic components, such as for example optoelectronic components, in particular in the form of top contacts, require a good current supply or conductivity and optionally sufficient transparency.

SUMMARY OF THE INVENTION

An object of the present invention is to provide an electronic component with an electrode comprising a metal layer with reduced thickness and optionally improved transparency relative to the prior art.

The electronic component according to an embodiment of the invention comprises a substrate, at least one first electrode arranged on the substrate and a growth layer on the side of the electrode facing the substrate. The electrode arranged on the growth layer comprises a metal layer with a thickness of less than or equal to 30 nm and the growth layer has a thickness which is less than or equal to 10 nm.

A "substrate", as is used herein, may for example comprise a substrate, as is conventionally used in the prior art for an electronic component. The substrate may be a transparent substrate. It may however also be a non-transparent substrate. The substrate may, for example, comprise glass, quartz, sapphire, plastics films, metal, metal foils, silicon wafers or another suitable substrate material. A metal substrate is as a rule only used when the growth layer is not arranged directly thereon. According to the invention substrate is in particular taken to mean the layer on which all the other layers are subsequently applied during production of the electronic component. In the case of an optical electronic component or a radiation-emitting device, such subsequent layers may for example be layers needed for radiation emission.

The "first electrode" may be an anode or a cathode.

The term "growth layer", as used herein, denotes a layer on which an electrode comprising a metal layer is arranged (hereinafter also known as a growth electrode).

The growth layer may be formed of a material or comprise a material which is selected from transparent conductive oxides, such as for example metal oxides, such as zinc oxide, tin oxide, cadmium oxide, titanium oxide, indium oxide or indium-doped tin oxide (ITO), aluminium-doped zinc oxide (AZO), $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides.

The contribution of the growth layer to lateral current conduction is generally negligible.

Since the growth layer is a very thin layer, it does not necessarily have to be conductive. The growth layer may therefore likewise comprise dielectric oxides such as $Al_2O_3$, $WO_3$, $Re_2O_7$ and the like or be formed thereof.

The growth layer may be applied by means of physical vapour deposition, for example evaporation processes, such as thermal evaporation, electron beam evaporation, laser beam evaporation, arc evaporation, molecular beam epitaxy and the like, sputtering, such as ion beam assisted deposition and the like, or ion plating, chemical vapour deposition, such as plasma-assisted chemical vapour deposition and the like, or atomic layer deposition and the like.

The surface of the growth layer is in particular suitably prepared or constructed to allow uniform or homogeneous deposition of a metal layer to be deposited thereon. In one embodiment the surface of the growth layer may comprise an amorphous or substantially amorphous structure or an amorphous or substantially amorphous surface. A completely amorphous structure may for example be confirmed by means of X-ray diffraction (X-ray diffractograms) (no discrete Bragg reflections are obtained).

The term "metal layer", where used herein, denotes a layer which is formed substantially or completely of metal. The metal layer is arranged directly on the growth layer. It may be grown epitaxially on the growth layer. The thickness of the metal layer amounts to less than or equal to 30 nm, for example between 9 nm and 10 nm.

The metal layer may comprise a thickness of less than or equal to 15 nm, in particular of less than or equal to 12 nm.

In embodiments of the present invention in which the transparency of the metal layer is of particular significance, the thickness of the metal layer may for example amount to less than or equal to 14 nm, in particular less than or equal to 11 nm. For example, the thickness of a metal layer, which comprises an Ag layer or a layer of an Ag alloy (for example a layer of an Ag—Sm alloy), may amount to less than or equal to 14 nm, in particular less than or equal to 11 nm, for example between approx. 9 nm and approx. 10 nm.

The growth electrode may consist of the metal layer or comprise one or more layers or functional layers.

The metal layer of the growth electrode preferably comprises at least one metal, which is selected from the group consisting of aluminium, barium, indium, silver, gold, magnesium, calcium and lithium and combinations thereof. The metal layer may alternatively consist of one of the above-stated metals or a compound with one of these metals or of a plurality of these metals, in particular an alloy.

The growth electrode may be used in transparent and non-transparent electronic, optical or electro-optical components. The growth electrode arranged on the growth layer may be used as a top contact, substrate contact and/or intermediate contact.

The electronic component according to an embodiment of the invention may, without being limited thereto, for example take the form of an optoelectronic component, in particular an organic electronic component, such as for example a solar cell, a phototransistor, light-emitting diode or the like.

The term "layer", as used herein, may mean an individual layer or a layer sequence consisting of a plurality of thin layers. In particular, the functional layers, for example organic functional layers, may be formed of a plurality of layers. The metal layer and the growth layer are generally single-layered.

The term "arranged on one another", as used herein, means that a layer is arranged immediately in direct mechanical and/or electrical contact on another layer. A layer may also be arranged indirectly on another layer, it then being possible for further layers to be present between the stated layers. Such layers may serve to improve further the functionality and thus the efficiency of the electronic component. Normally, the metal layer is arranged directly on the growth layer.

With the combination of growth layer and metal layer provided according to the invention in the electronic component it is advantageously possible to provide a very thin and at the same time highly conductive contact, which may additionally, if necessary, also be highly transparent.

By depositing the metal layer on the thin growth layer, the growth electrode may be of advantageously uniform, smooth and substantially homogeneous construction. It may in particular for this reason be significantly thinner than according to the prior art. It is thus advantageously possible, unlike with the transparent contacts used in the prior art consisting either of transparent conductive oxides with a conductivity of greater than 15 $\Omega/\square$ or of thin metal layers with a thickness of at least 20 nm, to achieve a high transparency and good current supply even in the case of large-area applications.

In the case of the electronic components according to an embodiment of the invention, for which transparency is essential, a compromise may thus advantageously be made between transparency and conductivity of transparent metallic contacts, since the metal layer deposited on the growth layer may advantageously be sufficiently thin, smooth and continuous for example to provide sufficient conductivity and at the same time excellent transparency.

Further configurations of the radiation-emitting device constitute the subject matter of subclaims.

In a further embodiment of the electronic component according to the invention, the growth layer in particular has a thickness of 1 nm to 8 nm. The growth layer preferably has a thickness of 3 nm to 3.5 nm. In certain embodiments a thickness of greater than or equal to 1.5 nm may be advantageous. The thickness of the growth layer may in certain embodiments for example be less than or equal to 7 nm.

In one embodiment of the electronic component according to the invention the growth layer is selected from a layer of indium-doped tin oxide (ITO) and a layer of aluminium-doped zinc oxide (AZO).

In a further embodiment of the electronic component according to the invention, the metal layer comprises a uniformity in thickness of ±10%, often even of ±5%.

The term "uniformity in thickness", as used herein, means that the metal layer may have a virtually constant thickness substantially over its complete length, i.e. a thickness with a maximum deviation of for example ±10%. This may for example be achieved in particular by the (thin) growth layer arranged under the metal layer.

The maximum thickness of a "30 nm thick" metal layer may thus amount for example to 33 nm at most, while the maximum thickness of a "12 nm thick" metal layer may amount for example to 13.2 nm at most.

In a further embodiment of the present invention, the surface resistivity of the growth electrode on the growth layer amounts to less than or equal to 6 $\Omega/\square$. The surface resistivity may amount in particular to less than or equal to 5 $\Omega/\square$. For example, the surface resistivity may amount to between 4 $\Omega/\square$ and 5 $\Omega/\square$.

The term "surface resistivity", as used herein, denotes the isotropic specific resistance of a layer relative to the thickness thereof. Surface resistivity may be measured for example by means of the 4-point method. Alternatively, surface resistivity may also be measured using the special Van der Pauw method.

The surface resistivity may thus advantageously be less than has hitherto been usual in the prior art with comparable electrode layers, which were deposited on a different substrate from the growth layer according to the present invention. With the arrangement according to the invention it may advantageously be possible, in optoelectronic components with sufficient transparency; to achieve a uniform current supply to the thin growth electrode.

In a further embodiment the electronic component according to the invention is an organic electronic component and additionally comprises a second electrode and at least one organic functional layer arranged between the first electrode and the second electrode.

The organic electronic component is for example an optoelectronic component or a radiation-emitting device.

The "first electrode" may be an anode. It may exhibit hole-injecting functions.

The "second electrode" may be a cathode. The first electrode and the second electrode are contacted electrically in a suitable manner.

The electrode, which is arranged on the growth layer, is, as previously stated, also designated a growth electrode. The growth electrode may be provided as an anode or cathode or form part of one. For the sake of clarity, according to the present invention the arrangements mentioned always comprise precisely one growth electrode. However, both electrodes may also comprise a growth layer with a metal layer arranged directly thereon.

The electrode which is not arranged on a growth layer may be formed of a material or comprise a material which is selected from metals such as aluminium, barium, indium, silver, gold, magnesium, calcium and lithium and combinations thereof or a compound thereof, in particular an alloy, as well as transparent conductive oxides, such as for example metal oxides, such as zinc oxide, tin oxide, cadmium oxide, titanium oxide, indium oxide or indium-doped tin oxide (ITO), aluminium-doped zinc oxide (AZO), $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides.

An "organic functional layer" may contain emitter layers, for example with fluorescent and/or phosphorescent emitters.

Examples of emitter materials which may be used in the electronic component according to the invention or the radiation-emitting device of the present invention include organic or organometallic compounds, such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)-iridium III), green phosphorescent Ir(ppy)$_3$ (tris(2-phenylpyridine)iridium III), red phosphorescent Ru(dtb-bpy)$_3$*2(PF$_6$(tris[4,4'-di-tert.-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylidene)-2-methyl-6-julolidyl-9-enyl-4H-pyran) as non-polymeric emitters. Such non-polymeric emitters may for example be deposited by means of thermal evaporation. In addition, polymer emitters may be used, which may be deposited in particular by wet chemical methods, such as for example spin coating.

The emitter materials may be suitably embedded in a matrix material.

The emitter materials of the emitter layer of the electronic component may in particular be selected such that the electronic component emits white light. The emitter layer may comprise a plurality of emitter materials emitting in different colours (for example blue and yellow or blue, green and red), or alternatively the emitter layer may also be constructed from a plurality of sublayers, such as a blue fluorescent emitter layer, a green phosphorescent emitter layer and a red phosphorescent emitter layer. By mixing the different colours, light may be emitted which has a white colour appearance. Alternatively provision may also be made for a converter material to be arranged in the beam path of the primary emission generated by these layers, which converter material at least partially absorbs the primary radiation and emits a secondary radiation of a different wavelength, such that a white colour appearance is produced from a (not yet white) primary radiation through the combination of primary and secondary radiation.

The electronic component may in general comprise further organic functional layers, which serve to improve further the functionality and thus the efficiency of the electronic component.

For example, organic functional layers may be selected which serve to improve the functionality and efficiency of the first electrode and/or the second electrode and of charge carrier and exciton transport.

The electronic component may take the form of a "bottom emitter" and/or "top emitter".

In one embodiment of the present invention, the growth layer is arranged between the organic functional layer and the growth electrode. The growth electrode may in this case be a cathode.

The arrangement of the growth layer and the growth electrode may form a transparent top contact for a top emitter.

In another embodiment of the present invention the growth layer is arranged as growth electrode between the substrate and the electrode on the substrate side (i.e. the electrode which is at a smaller distance from the substrate). The growth electrode may in this case be an anode. The substrate may preferably be a transparent substrate such as glass, quartz, sapphire, plastics film and the like.

The arrangement of growth layer and growth electrode may form a transparent substrate contact for a bottom emitter.

Very generally, in the case of a top or bottom emitter one electrode of the radiation-emitting device in the form of the growth electrode according to the present invention may be transparent and the other electrode reflective. Alternatively, both electrodes may be transparent.

The metal layer of the growth electrode therefore in particular forms a transparent thin-film contact.

The term "bottom emitter", as used herein, denotes an embodiment which is transparent towards the substrate side of the electronic component. In particular to this end at least the substrate, the first electrode and the growth layer arranged between the substrate and the first electrode may be transparent. An electronic component in the form of a bottom emitter may accordingly for example emit radiation generated in the organic functional layers on the substrate side of the electronic component.

Alternatively or in addition, the electronic component according to an embodiment of the invention may take the form of a "top-emitter". The term "top emitter", as used herein, denotes an embodiment which is transparent towards the second electrode side of the electronic component. In particular, the growth layer and the growth electrode may to this end be arranged remote from the substrate and be of transparent construction. An electronic component in the form of a top emitter may accordingly for example emit radiation generated in the organic functional layers on the side of the electronic component on which is located the electrode remote from the substrate.

An electronic component of the present invention configured as a top emitter, in which the growth layer and the metal layer are provided as a top contact, may advantageously exhibit good light outcoupling and a very low angle dependence of the radiance. The radiation-emitting device according to the invention may advantageously be used for lighting systems, such as for example for interior lighting.

A combination of bottom and top emitters is likewise possible. In such an embodiment the electronic component is generally capable of emitting the light generated in the organic functional layers in both directions, i.e. both towards the substrate side and towards the side remote from the substrate.

In a further embodiment of the present invention at least one third electrode is arranged between the first electrode and the second electrode and the growth layer is arranged on the side of the third electrode facing the substrate.

The "third electrode" may function as an intermediate contact. It may serve to increase charge transport through the layers of the electronic component and so advantageously improve the efficiency of the electronic component. The third electrode may be configured as an ambipolar layer, i.e. it may be configured as cathode or anode. The arrangement of the growth layer and the growth electrode of the present embodiment then forms a transparent intermediate contact. As with the first and second electrodes, the third electrode is electrically contacted.

In a further development of the electronic component of the present invention, an emitter layer and one or more further organic functional layers are included as organic functional layers. The further organic functional layers may be selected from the group consisting of hole injection layers, hole transport layers, hole blocking layers, electron injection layers, electron transport layers and electron blocking layers.

Suitable functional layers and suitable organic functional layers are known to a person skilled in the art. The (organic) functional layers may preferably be applied by means of thermal evaporation. The further (organic) functional layers may advantageously improve the functionality and/or efficiency of the electronic component.

In a further embodiment of the present invention, the electronic component takes the form of an organic light-emitting diode (OLED).

In a further development of the electronic component the electronic component exhibits a substantially Lambertian emission pattern.

The term "Lambertian emission pattern", as used herein, denotes the ideal emission behaviour of a "Lambertian radiator".

A "substantially" Lambertian emission pattern, as described herein, here means in particular that the emission pattern, which is calculated according to the formula $$I(\theta) = I_0 \cdot \cos \theta$$

and in which $I_0$ is the intensity relative to a surface normal and $\theta$ indicates the angle to the surface normal, deviates, for a given angle, in particular in the case of an angle of between −70° and +70°, for each stated angle θ by no more than 10% from the intensity according to the above-stated formula, i.e. $I(\theta) = I_0 \cdot \cos \theta \cdot x$, wherein x=90%-110%.

In this way it may advantageously be possible to achieve constant radiance or luminance of the electronic component of the present invention in all directions, such that the electronic component appears equally bright in all directions. The brightness of the electronic component may advantageously not change even when it is tilted relative to the direction of view.

In a further embodiment the transparency of the electronic component amounts to greater than or equal to 60%. Preferably, the transparency may be greater than or equal to 65%. The transparency is measured by means of intensity measurements, in that predetermined wavelength ranges are scanned and the quantity of light passing through the radiation-emitting device is detected.

The term "transparency", as used herein, denotes the ability of the individual layers of the electronic component according to the invention to let electromagnetic waves, and in particular visible light, through. The transparency of the electronic component according to the present invention amounts normally at least for at least one specific wavelength to more than 60%, preferably more than 65%. The transparency for at least one wavelength in a wavelength range of approx. 400 nm to approx. 450 nm may in particular amount to more than 60% and preferably more than 65%. The arrangement according to the invention of the growth layer and the growth electrode may thus advantageously provide improved transparency relative to the prior art at the same time a sufficient current supply.

In a further embodiment of the present invention, the growth layer is applied by means of sputtering. The growth layer may be applied in particular by means of facing target sputtering or hollow cathode sputtering.

The term "facing target sputtering", as used herein, denotes a single-stage process, by means of which continuous epitaxial layers may be obtained.

The term "hollow cathode sputtering", as used herein, denotes a sputtering process using a hollow cathode sputtering installation, which comprises a hollow cathode of target material. In comparison with the sputtering method conventionally proceeding at a pressure of <1 Pa, in hollow cathode sputtering improved properties of the growth layer may be achieved, since advantageously virtually no bombardment of the layer with energetic neutral particles reflected by the target takes place.

The growth layer deposited by means of facing target sputtering or hollow cathode sputtering as a rule exhibits a substantially amorphous appearance or a substantially amorphous surface. A thin metal layer may be particularly readily deposited on such an amorphous surface, in order in this way advantageously to provide a transparent contact for an electronic component of the present invention. Layers applied by means of sputtering generally comprise inclusions which contain the process gas used for sputtering (for example argon).

By using a sputtering method to apply the growth layer, deposition of non-stoichiometric layers, which may result from thermal evaporation at excessively high temperatures, may be avoided, wherein, due to the very thin growth layer provided according to the invention, it is possible to avoid the damage to the underlying layers which frequently arises with reactive sputtering as the coating time increases as a result of various influences from the sputtering plasma. By applying the growth layer by means of sputtering, it is thus advantageously possible to achieve damage-free and/or stoichiometric application of the growth layer. This may be in particular be advantageous for example when coating sensitive structures, such as are present for example in organic light-emitting diodes.

In a further embodiment of the present invention the metal layer is applied immediately after the growth layer.

The phrase "applied immediately after" or preferably "applied one after the other", as used herein, means that the metal layer is deposited immediately after the growth layer during the production process of the electronic component, for example without reactor change or no later than one day after deposition of the growth layer.

Immediate deposition of the metal layer on the growth layer may prevent ageing of the growth layer, in particular no or only slight ageing of the for example amorphous surface occurs, whereby its amorphous appearance may be retained for suitable deposition of the metal layer.

The electronic component according to an embodiment of the present invention may moreover comprise further functional layers, such as for example antireflection layers, scattering layers, layers for the colour conversion of light and/or mechanical protective layers. Such layers may for example be arranged on the metal layer of the growth electrode. The functional layers may preferably be applied by means of thermal evaporation. These layers may further improve the function and efficiency of the radiation-emitting device.

An electrical contact according to an embodiment of the present invention is suitable for use in or with an electronic component.

The electrical contact according to an embodiment of the invention comprises a substrate, at least one first electrode arranged on the substrate and a growth layer on the side of the electrode facing the substrate, wherein the electrode arranged on the growth layer comprises a metal layer with a thickness of less than or equal to 30 nm and the growth layer has a thickness which is less than or equal to 10 nm, wherein the growth layer is arranged in particular directly on the substrate.

Since substantially all those advantages may be achieved with the electrical contact according to the invention which may be achieved with the electronic component according to the invention, for further embodiments reference is made to the above explanations, to avoid repetition.

BRIEF DESCRIPTION OF THE DRAWINGS

The present invention is illustrated in greater detail below by embodiments with reference to the attached figures. In the figures similar or identical elements are labelled with the same reference signs. In the Figures.

DETAILED DESCRIPTION OF THE DRAWINGS

In the following embodiments, which are described by way of example with reference to the drawings, the electronic component according to the invention is illustrated as a radiation-emitting device, in particular as an OLED.

Figure 1:
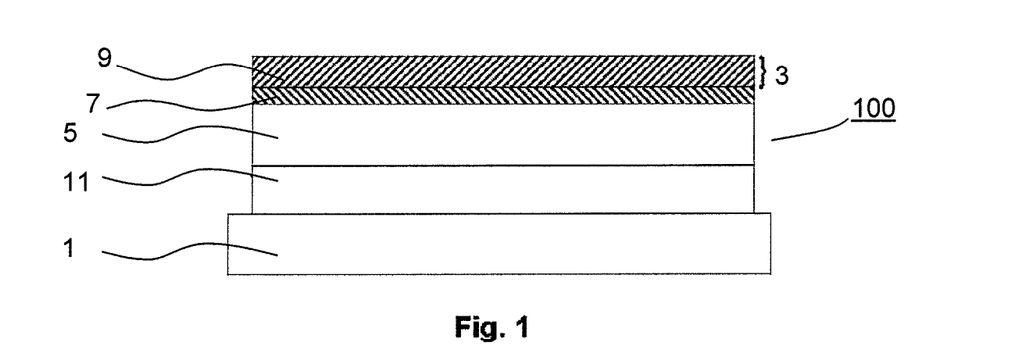
FIG. 1 shows a schematically simplified side view of an electronic component according to a first embodiment of the present invention in partial section.

FIG. 1 shows a schematically simplified side view of an electronic component 100 according to a first embodiment of the present invention, which is configured as a top/bottom emitter.

A second electrode 11 is arranged on a substrate 1, for example a glass substrate. The second electrode 11 may be an anode, for example, and be formed for example from indium-doped tin oxide (ITO).

An organic functional layer 5, such as for example a fluorescent and/or phosphorescent emitter layer, is arranged on the second electrode 11.

A growth layer 7 is arranged on the organic functional layer 5. The growth layer 7 may for example be 3 nm thick and be deposited by means of facing target sputtering.

A growth electrode, for example in the form of a 10 nm thick metal layer 9, is deposited on the growth layer 7 as first electrode 3. The metal layer 9 may for example be deposited by means of sputtering. The first electrode 3 comprising the metal layer 9 is a cathode, if the second electrode 11 is an anode. The growth layer 7 is in this case arranged according to the invention on the side of the first electrode 3 facing the substrate 1.

Figure 2:
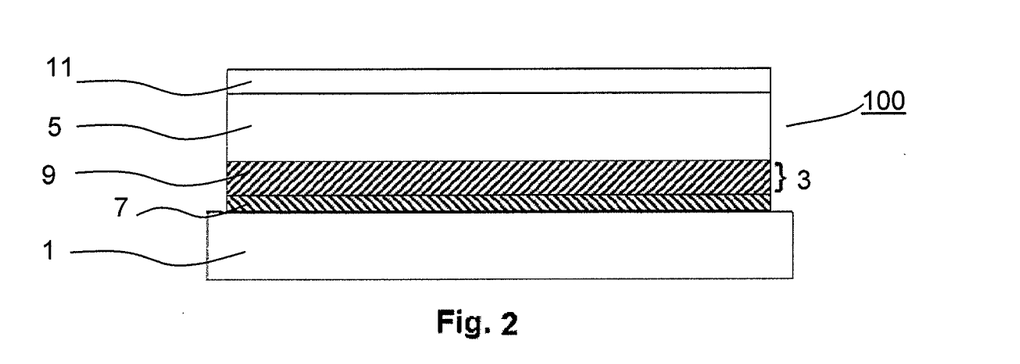
FIG. 2 shows a schematically simplified side view of an electronic component according to a second embodiment of the present invention in partial section.

FIG. 2 shows a schematically simplified side view of an electronic component 100 according to a second embodiment of the present invention, which is configured as a bottom emitter.

A growth layer 7 is arranged on the substrate 1, such as a glass substrate, and a growth electrode in the form of a metal layer 9 is arranged on the growth layer 7 as first electrode 3. The first electrode 3 may take the form of an anode. The growth layer 7 is arranged according to the invention on the side of the first electrode 3 facing the substrate 1. The growth layer 7 may advantageously serve to improve the surface to which a growth electrode has been applied, i.e. to treat it in such a manner that the metal layer 9 may be deposited thinly, smoothly and uniformly, in order to allow improved current supply and improved transparency of the electronic component 100.

An organic functional layer 5 is arranged on the metal layer 9. The organic functional layer 5 may comprise an emitter layer.

The second electrode 11 is arranged on the organic functional layer 5. If the first electrode 3 is an anode, the second electrode 11 is a cathode. It may for example be a conventional 20 nm thick silver layer.

Figure 3:
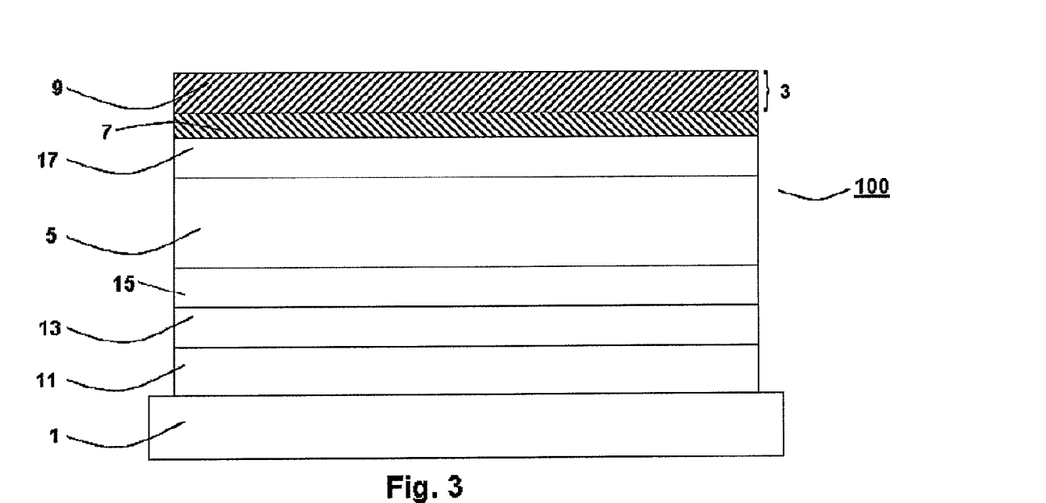
FIG. 3 shows a schematically simplified side view of an electronic component according to a third embodiment of the present invention in partial section.

FIG. 3 shows a schematically simplified side view of an electronic component 100 according to a third embodiment of the present invention, which is configured as a top emitter.

A second electrode 11 is arranged on a substrate 1. As shown in FIG. 3, the second electrode 11 may be an anode and be formed for example from indium-doped tin oxide (ITO).

A hole injection layer 13 is arranged on the second electrode 11 and a hole transport layer 15 on the hole injection layer. The hole injection layer 13 and the hole transport layer 15 may be deposited by means of thermal evaporation.

A further organic functional layer 5, such as for example a fluorescent and/or phosphorescent emitter layer, is arranged on the hole transport layer 15.

An electron transport layer 17 is arranged on the organic functional layer 5 and may likewise be deposited by means of thermal evaporation. A growth layer 7 is arranged on the electron transport layer 17. The growth layer 7 may for example be 3 nm thick and be deposited by means of facing target sputtering.

A growth electrode, for example in the form of a 10 nm thick metal layer 9, is deposited on the growth layer 7 as first electrode 3. The metal layer 9 may preferably be deposited by means of sputtering. As shown in FIG. 3, the first electrode 3 comprising the metal layer 9 is a cathode.

Figure 4:
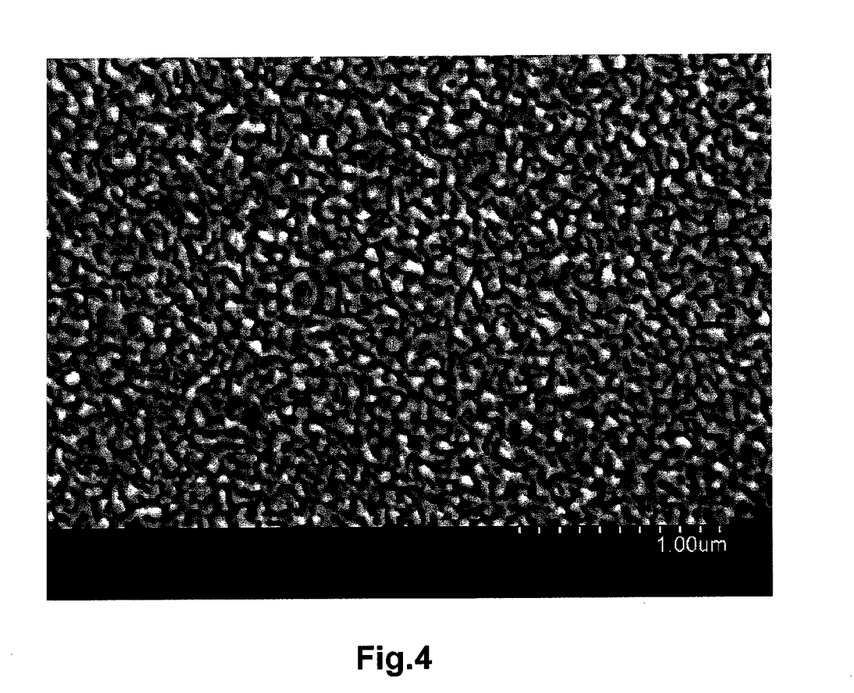
FIG. 4 shows an SEM micrograph of a thin silver layer, deposited on a glass substrate.

FIG. 4 shows an SEM micrograph of a thin silver layer, deposited on a glass substrate. The silver layer is 12 nm thick and was applied to the glass substrate by means of thermal evaporation. As is visible from FIG. 4, the silver layer has a strong tendency to islanding; the glass substrate is discernible between the metal islands. The silver layer is therefore not formed smoothly and uniformly on the glass substrate. The surface resistivity of this silver layer measured with a 4-point measuring instrument amounts to 19.3 $\Omega/\square \pm 1.9\ \Omega/\square$.

Figure 5:
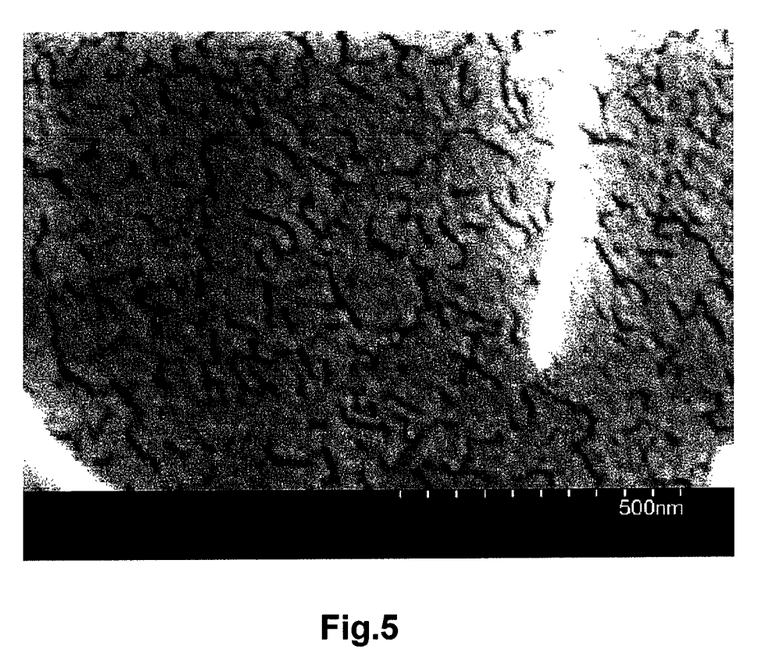
FIG. 5 shows an SEM micrograph of a thin silver layer, deposited on a conventional organic support.

FIG. 5 shows an SEM micrograph of a 12 nm silver layer, which is deposited on an organic support or ground by thermal evaporation. The organic support is deposited on a glass substrate and consists of a conventional matrix material, such as for example α-NPD (N,N'-diphenyl-N,N'-bis(1-naphthyl)-1,1'-biphenyl-4,4''-diamine. The silver layer's tendency to islanding is significantly less than in FIG. 4, but distinct cracks are apparent. The surface resistivity of this silver layer measured with a 4-point measuring instrument amounts to 7.13 $\Omega/\square \pm 0.37\ \Omega/\square$.

Figure 6:
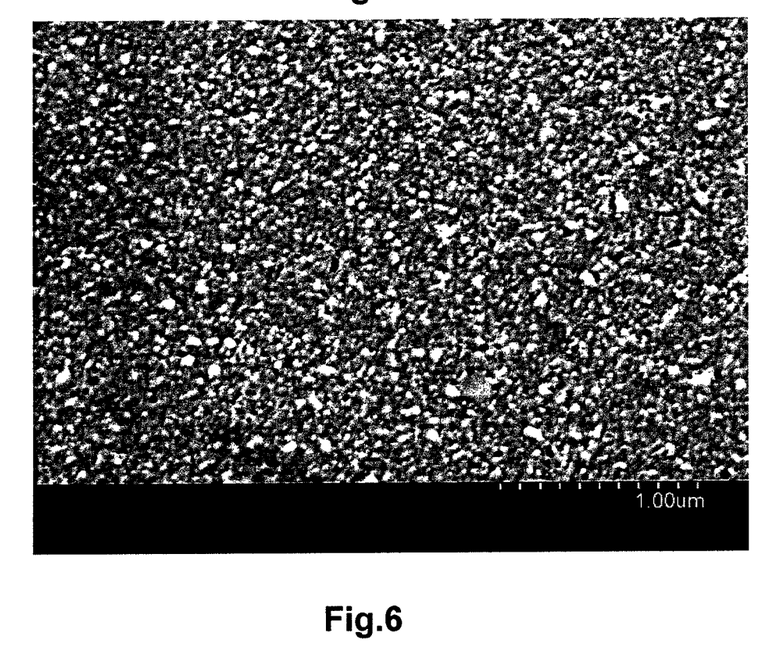
FIG. 6 shows an SEM micrograph of a thin silver layer deposited according to an embodiment of the invention on an ITO growth layer.

FIG. 6 shows an SEM micrograph of a 12 nm thick silver layer, which was deposited according to the invention by sputtering on a 17 nm thick ITO growth layer. The ITO growth layer was in turn applied to a 90 nm thick organic support, as indicated for example above in relation to FIG. 5. The organic support was applied to a glass substrate. As is clear from FIG. 6, the silver layer is smooth and continuous. The surface resistivity of this silver layer measured with a 4-point measuring instrument amounts to 4.48 $\Omega/\square \pm 0.20\ \Omega/\square$.

The thin amorphous growth layer according to the present invention makes it advantageously possible for the metal layer, in comparison with conventional metal layers or electrode layers with a thickness of for example 20 nm, to be deposited thinly, smoothly and as a continuous layer on the growth layer.

Figure 7:
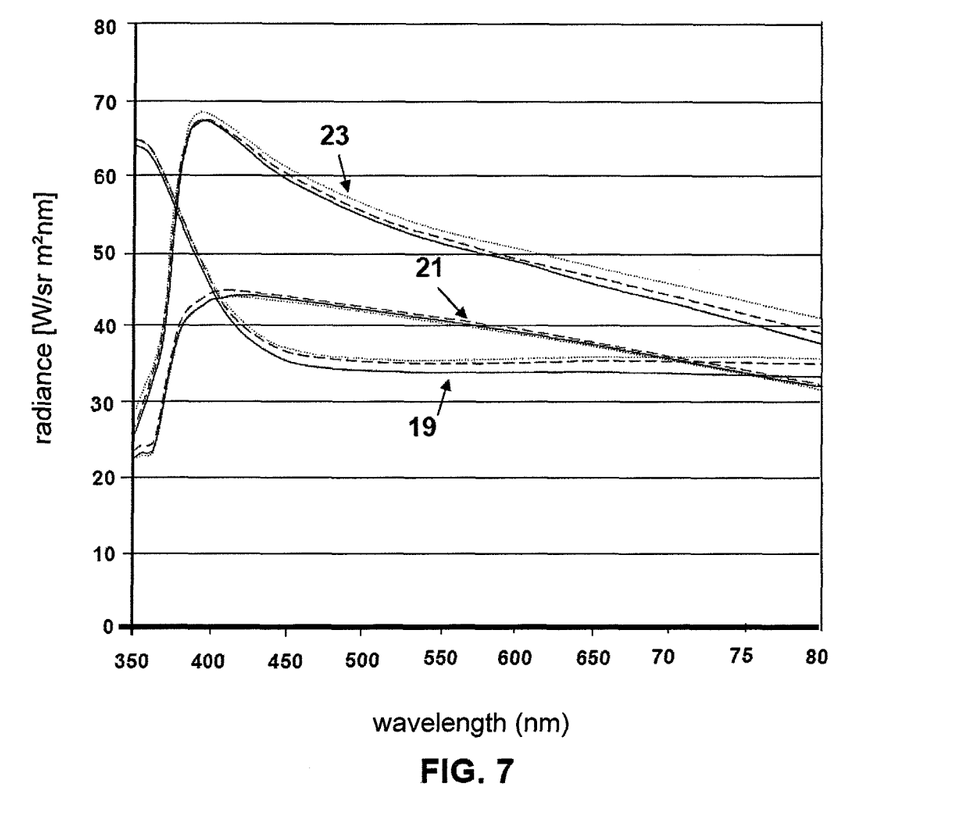
FIG. 7 shows a graph which shows the result of a transparency measurement of the silver layer from FIGS. 3 to 5.

FIG. 7 shows a graph which shows the result of a transparency measurement of the silver layers (silver layer on glass substrate according to FIG. 4, silver layer on organic support on glass substrate according to FIG. 5 and silver layer on ITO layer on organic support on glass substrate according to FIG. 5) from FIGS. 4 to 6. Three measurements were carried out per example. The transparency [%] was stated relative to wavelength [nm].

The silver layer on glass support 19 of FIG. 4 exhibits a radiance of approx. 65% at a wavelength of approx. 355 nm, which falls from approx. 410 nm to a minimum value of approx. 35% and remains constant at higher wavelengths.

The silver layer on organic support 21 from FIG. 5 exhibits a maximum transparency of approx. 43% at approx. 400 nm. The transparency slowly falls at higher wavelengths to a value of approx. 32%.

The silver layer according to the invention on indium-doped tin oxide (ITO) 23 from FIG. 6 exhibits a maximum transparency at approx. 400 nm of approx. 68%. In the range from approx. 380 nm to approx. 450 nm the transparency is greater than 60%. The transparency of the silver layer on indium-doped tin oxide 23 is markedly greater than that of the other layers 19 and 21.

Figure 8:
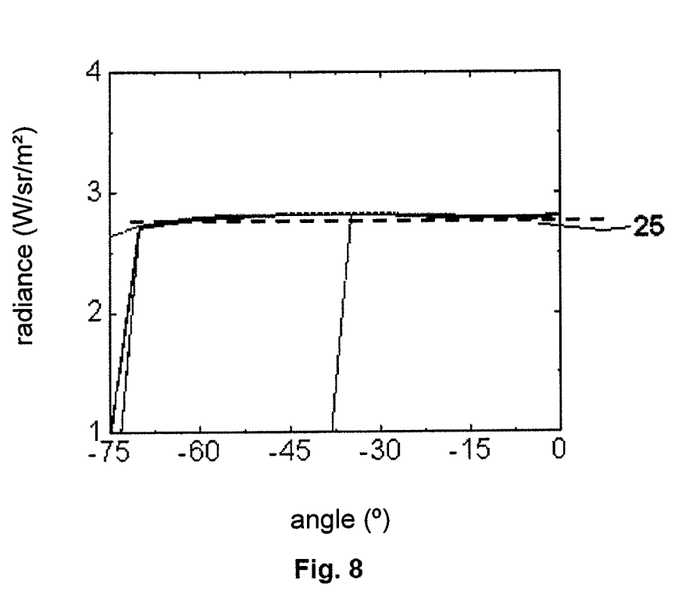
FIG. 8 shows emission patterns for an electro-optical component according to an embodiment of the invention.

FIG. 8 shows the emission patterns of an optoelectronic component according to the invention. Three measurements were carried out. The emission patterns are represented as radiance (stated in $[W/(sr/m^2)]$) relative to the viewing angle (stated in degrees [°]). The unit "sr" denotes the steradian, i.e. the solid angle.

The emission pattern 25 of the arrangement described in FIG. 5 of an electronic component according to the invention, which is constructed for example as a top-emitting OLED, displays a substantially Lambertian emission pattern (the Lambertian emission pattern is shown as a dashed line and does not bear a reference sign).

The exemplary embodiments of the present invention may be further varied at will. It should furthermore be borne in mind that the invention is not restricted to these examples, but instead permits further configurations and embodiments which are not listed here.

The invention claimed is:

1. An electronic component comprising:
   a substrate;
   a first electrode arranged on said substrate, said first electrode having two opposed surfaces facing toward and away from said substrate, respectively; and
   a growth layer arranged directly on the surface of said first electrode facing toward said substrate, said growth layer having two opposed surfaces, one of which faces toward said substrate,
   wherein said first electrode consists of a metal layer with a thickness of less than or equal to 30 nm,
   wherein said growth layer has a thickness of less than or equal to 10 nm and consists of a transparent conductive oxide,
   wherein the electronic component is an organic light emitting diode (OLED) that comprises a second electrode and at least one organic functional layer, said at least one organic functional layer containing an emitter layer with at least one of fluorescent and phosphorescent emitters and being arranged between said first electrode and said second electrode, wherein the first and second electrodes are configured to supply current to the organic functional layer,
   wherein said at least one organic functional layer is arranged directly on the surface of said growth layer facing toward said substrate,
   wherein a contribution of the growth layer to a lateral current conduction is negligible and the surface of the growth layer facing the first electrode is configured to allow homogeneous deposition of the metal layer of the first electrode, and said surface of the growth layer is an amorphous surface,
   wherein a further functional layer is arranged directly on the surface of said first electrode facing away from said substrate, and
   wherein said further functional layer includes one of an antireflection layer, a scattering layer, a layer for a color conversion of light, and a mechanical protection layer.

2. The electronic component according to claim 1, wherein said growth layer has a thickness of 1 nm to 8 nm.

3. The electronic component according to claim 1, wherein said second electrode is arranged directly on said substrate, wherein said at least one organic functional layer is arranged directly on said second electrode, and wherein said growth layer is selected from a layer of indium-doped tin oxide and a layer of aluminum-doped zinc oxide.

4. The electronic component according to claim 1, wherein said metal layer has a uniformity in thickness of ±10%.

5. The electronic component according to claim 1, wherein said metal layer comprises at least one of aluminum, barium, indium, silver, gold, magnesium, calcium and lithium.

6. The electronic component according to claim 1, wherein a surface resistivity of the electronic component is less than or equal to 5Ω.

7. The electronic component according to claim 1, wherein said OLED exhibits a substantially Lambertian emission pattern.

8. The electronic component according to claim 1, wherein said OLED has a transparency greater than or equal to 60%.

9. An electronic component comprising:
   a substrate;
   a first electrode arranged on said substrate, said first electrode having two opposed surfaces facing toward and away from said substrate, respectively; and
   a growth layer arranged directly on the surface of said first electrode facing toward said substrate, said growth layer having two opposed surfaces, one of which faces toward said substrate,
   wherein said first electrode consists of a metal layer with a thickness of less than or equal to 12 nm,
   wherein said growth layer has a thickness of between 1.5 nm and 7 nm,
   wherein said growth layer comprises one of $WO_3$ and $Re_2O_7$ as a dielectric oxide,
   wherein at least one of said two opposed surfaces of said growth layer is an amorphous surface,
   wherein the electronic component is an organic light emitting diode (OLED) that comprises a second electrode and at least one organic functional layer, said at least one organic functional layer containing an emitter layer with at least one of fluorescent and phosphorescent emitters and being arranged between said first electrode and said second electrode,
   wherein the first and second electrodes are configured to supply current to the organic functional layer,
   wherein a contribution of the growth layer to a lateral current conduction is negligible and the surface of the growth layer facing the first electrode is configured to allow homogeneous deposition of the metal layer of the first electrode, and said surface of the growth layer is an amorphous surface, and
   wherein one of:
      said at least one organic functional layer is arranged directly on the surface of said growth layer facing toward said substrate, a further functional layer is arranged directly on the surface of said first electrode facing away from said substrate, said further functional layer including one of an antireflection layer, a scattering layer, a layer for a color conversion of light, and a mechanical protection layer; and
      said growth layer is arranged between said substrate and said first electrode, said at least one organic functional layer is arranged directly on the surface of said first electrode facing away from said substrate.

10. An electronic component comprising:
    a substrate;
    a first electrode arranged on said substrate, said first electrode having two opposed surfaces facing toward and away from said substrate, respectively; and
    a growth layer arranged directly on the surface of said first electrode facing toward said substrate,
    wherein said first electrode consists of a metal layer with a thickness of less than or equal to 30 nm,
    wherein said growth layer has a thickness of less than or equal to 10 nm and consists of a transparent conductive oxide,
    wherein the electronic component is an organic light emitting diode (OLED) that comprises a second electrode and at least one organic functional layer containing an emitter layer with at least one of fluorescent and phosphorescent emitters and, said at least one organic functional layer being arranged between said first electrode and said second electrode, wherein the first and second electrodes are configured to supply current to the organic functional layer, wherein said growth layer is arranged between said substrate and said first electrode, and wherein said at least one organic functional layer is arranged directly on the surface of said first electrode facing away from said substrate wherein a contribution of the growth layer to a lateral current conduction is negligible and the surface of the growth layer facing the first electrode is configured to allow homogeneous deposition of the metal layer of the first electrode, and said surface of the growth layer is an amorphous surface.

11. The electronic component according to claim 10, wherein said growth layer has a thickness of 1 nm to 8 nm.

12. The electronic component according to claim 10, wherein said growth layer is the only growth layer in the electronic component and arranged directly on said substrate, wherein said second electrode is arranged directly on said at least one organic functional layer, and wherein said growth layer is selected from a layer of indium-doped tin oxide and a layer of aluminum-doped zinc oxide.

13. The electronic component according to claim 10, wherein said metal layer has a uniformity in thickness of ±10%.

14. The electronic component according to claim 10, wherein said metal layer comprises at least one of aluminum, barium, indium, silver, gold, magnesium, calcium and lithium.

15. The electronic component according to claim 10, wherein a surface resistivity of the electronic component is less than or equal to 5Ω.

16. The electronic component according to claim 10, wherein the electronic component exhibits a substantially Lambertian emission pattern.

17. The electronic component according to claim 10, wherein the electronic component has a transparency greater than or equal to 60%.

* * * * *